(12) United States Patent
Badrudduza et al.

(10) Patent No.: US 8,913,456 B2
(45) Date of Patent: Dec. 16, 2014

(54) SRAM WITH IMPROVED WRITE OPERATION

(71) Applicants: Sayeed A. Badrudduza, Austin, TX (US); Glenn C. Abeln, Buda, TX (US)

(72) Inventors: Sayeed A. Badrudduza, Austin, TX (US); Glenn C. Abeln, Buda, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 230 days.

(21) Appl. No.: 13/661,861

(22) Filed: Oct. 26, 2012

(65) Prior Publication Data

US 2014/0119100 A1 May 1, 2014

(51) Int. Cl.
*G11C 8/00* (2006.01)

(52) U.S. Cl.
USPC .................................. 365/230.06; 365/189.06

(58) Field of Classification Search
USPC ................................. 365/230.06, 189.06, 154
See application file for complete search history.

(56) References Cited

U.S. PATENT DOCUMENTS 6,646,949 B1 * 11/2003 Ellis et al. ................ 365/230.06
7,852,661 B2    12/2010 Liu
2008/0117665 A1   5/2008 Abeln et al.
2011/0258395 A1 * 10/2011 Chan et al. .................... 711/142
2011/0299349 A1 * 12/2011 Deng et al. .................... 365/201

OTHER PUBLICATIONS

Jain, S., et al., "A 280mV-to-1.2V Wide-Operating-Range IA-32 Processor in 32nm CMOS", ISSCC 2012, Session 3, Processors, 3.6, IEEE international Solid-State Circuits Conference, Apr. 12, 2012, pp. 66-68.

* cited by examiner

*Primary Examiner* — Vu Le
(74) *Attorney, Agent, or Firm* — Mary Jo Bertani; David G. Dolezal

(57) ABSTRACT

A memory including an array of memory cells, word lines, and voltage supply lines. Each voltage supply line of the plurality of voltage supply lines is coupled to a first voltage supply terminal of a subset of memory cells of subsets of memory cells of the array. Each memory cell of the array is coupled to a word line. The memory includes a row decoder that controls a voltage on each of the word lines and controls a voltage on each of the voltage supply lines. The row decoder provides a low voltage state voltage on one of the voltage supply lines during a write operation to a subset of memory cells coupled to the voltage supply line and the row decoder provides a high voltage state voltage to the voltage supply line during a read operation of the subset of the memory cells.

20 Claims, 3 Drawing Sheets

SRAM WITH IMPROVED WRITE OPERATION

BACKGROUND

1. Field

This disclosure relates generally to semiconductor devices, and more specifically, to static random access memory (SRAM) having an improved write operation.

2. Related Art

Static random access memories (SRAMs) are generally used in applications requiring high speed, such as memory in a data processing system. Each SRAM cell stores one bit of data and is implemented as a pair of cross-coupled inverters. The SRAM cell is only stable in one of two possible voltage levels. The logic state of the cell is determined by whichever of the two inverter outputs is a logic high, and can be made to change states by applying a voltage of sufficient magnitude and duration to the appropriate cell input. The stability of a SRAM cell is an important issue. The SRAM cell must be stable against transients, process variations, soft errors, and power supply fluctuations which may cause the cell to inadvertently change logic states. Also, the SRAM cell should ideally provide good stability during read operations without harming speed and write operations without harming the ability to write to the cell.

A two-port SRAM cell has write and read word lines. A read port of the SRAM cell may include a pair of series-connected MOS (metal-oxide semiconductor) transistors coupled between a power supply terminal and a read bit line. A gate of one transistor is coupled to a storage node of the cell and the gate of the other transistor is connected to the read word line. Using a separate read port in this manner provides the advantage of having little or no adverse effect on cell read stability or the read margin.

Low voltage operation is becoming more common for SRAM in portable applications. Today, power supply voltages for an active memory cycle may be in the range of one volt or less. Providing a low voltage SRAM with adequate write margins and with good read stability may be difficult and usually comes at the expense of lower read and write performance.

Therefore, there is a need for a SRAM having improved write margins at low power supply voltages without decreasing cell stability.

BRIEF DESCRIPTION OF THE DRAWINGS

The present invention is illustrated by way of example, and not by way of limitation, in the figures of the accompanying drawings and in which like reference numerals refer to like elements and in which.

DETAILED DESCRIPTION

Generally, embodiments of the present invention provide single and two-port memory with the advantage of faster write operations at a lower power supply voltage than the write operations of a standard memory cell, where the standard memory cell has power supply voltage terminals coupled to receive a continuous power supply voltage.

Figure 1:
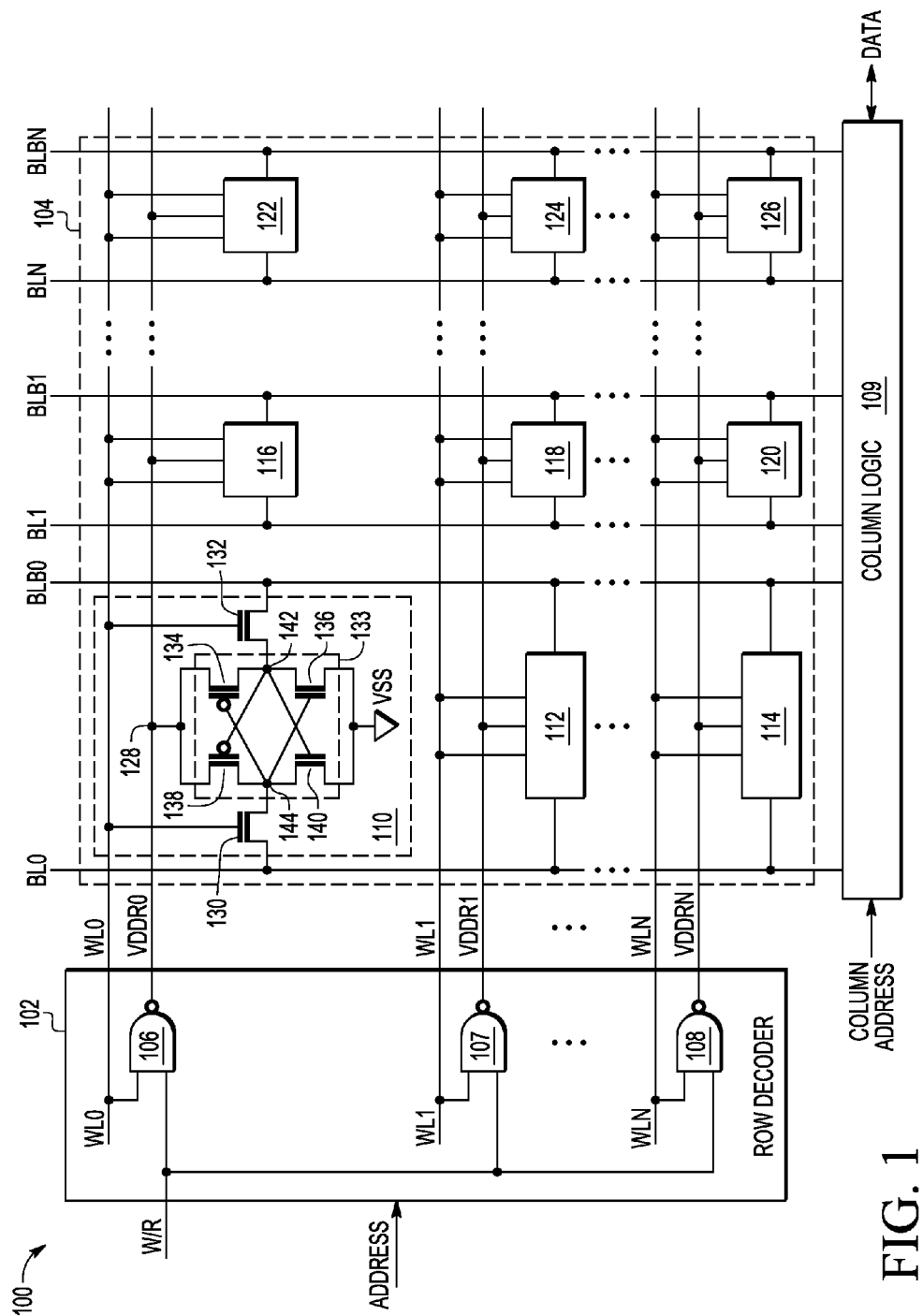
FIG. 1 illustrates, in block diagram form, an integrated circuit memory in accordance with an embodiment of the present invention.

FIG. 1 illustrates, in block diagram form, an integrated circuit memory 100 in accordance with an embodiment of the present invention. Generally, memory 100 includes a row decoder 102, an array of memory cells 104, and column logic 109. The plurality of memory cells 104 includes representative memory cells 110, 112, 114, 116, 118, 120, 122, 124, 126. As illustrated in FIG. 1, each of the memory cells is coupled to one of a plurality of word lines labeled "WL0" to "WLN", to one pair of a plurality of pairs of bit lines labeled "BL0/BLB0" to "BLN/BLBN". The plurality of memory cells 104 are implemented in rows and columns. For example, memory cells 110, 116, 122 and the word line WL0 form one row of memory cells. Likewise, memory cells 110, 112, 114 form one column of memory cells. Memory array 104 may include any suitable number of rows and columns of memory cells. Note that a letter "B" before the number in a signal name indicates that the signal name is a logical complement of a signal having the same name but lacking the "B". For example, the signal labeled "BLB0" is the logical complement of the signal labeled "BL0".

In one embodiment, memory 100 is implemented as a cache memory in an integrated circuit data processor. In another embodiment, memory 100 may be a stand-alone integrated circuit memory.

Power supply VDDR0 is routed to provide power to a first row of memory cells including memory cells 110, 116, 122. Power supply VDDR1 is routed to provide power to a second row of memory cells including memory cells 112, 118, 124. Power supply VDDRN is routed to provide power to a last row of memory cells including memory cells 114, 120, 126.

Memory cell 110 can be implemented in an integrated circuit using CMOS (complementary metal-oxide semiconductor) transistors. Memory cell 110 includes a pair of cross-coupled inverters 133 with one inverter having P-channel transistor 134 and N-channel transistor 136, and another inverter having P-channel transistor 138 and N-channel transistor 140. Data is retained at storage nodes 142, 144. Memory cell 110 also includes pass gates 130, 132 to read or write data on storage nodes 142, 144. Although memory cell 110 is shown in greater than detail than memory cells 112 to 126, memory cells 112 to 126 can have the same structure as memory cell 110.

P-channel transistor 138 has a source (current electrode) connected to a power supply "VDDR0" at a power supply node 128, a drain (current electrode) connected to a storage node 144, and a gate (control electrode) connected to a storage node 142. N-channel transistor 140 has a drain connected to the drain of P-channel transistor 138, a source connected to power supply VSS, and a gate connected to storage node 142.

P-channel transistor 134 has a source connected to VDDR0, a drain connected to storage node 142, and a gate connected to storage node 144. N-channel transistor 136 has a drain connected to storage node 142, a source connected to VSS, and a gate connected to storage node 144.

N-channel transistor 130 has a drain/source terminal connected to a bit line labeled "BL0", a drain/source terminal connected to storage node 144, and a gate connected to word line WL0. N-channel transistor 132 has a drain/source terminal connected to storage node 142, a drain/source terminal connected to bit line BLB0, and a gate connected to word line WL0.

Row decoder 102 receives a row address that is used to select one row of memory array 104 for read or write operations. Power supply voltage VDD is also provided to row decoder 102 and is conducted on word lines WL0 to WLN.

VDD can be any suitable voltage, such as, for example, one volt. Power supply voltage VSS can be ground. In other embodiments, the power supply voltages may be different. For example, VDD may be ground and VSS may be a negative voltage.

A write/read signal "W/R" is provided to row decoder 102 by a memory controller (not shown) or other suitable logic or input. W/R signal indicates whether a write or a read operation is being performed. Row decoder 102 further includes one of a plurality of NAND gates 106, 107, 108 with one input coupled to respective word line signals WL0 to WLN and another input coupled to the write/read signal W/R. The output of NAND gates 106, 107, 108 is coupled to respective power supplies VDDR0 to VDDRN. Power supplies VDDR0 to VDDRN are coupled to power supply nodes 128 for each memory cell in a respective row of memory cells.

NAND gates 106, 107, 108 can include one or more additional inputs. For example, an optional write assist enable signal "WAE" can be provided to enable/disable the write assist scheme.

Column logic 109 includes, for example, column decoder, sense amplifiers, bit line equalization and precharge circuits, and buffer circuits. Column logic 109 has an input terminal for receiving a column address labeled "COLUMN ADDRESS", a first plurality of terminals coupled to bit line pairs BL0/BLB0-BLN/BLBN, and a plurality of input/output (I/O) terminals for receiving or providing data signals labeled "DATA". As illustrated in FIG. 1, bit lines run in the column direction, and the word lines run in the row direction.

The column decoders of column logic 109 select which of the memory cells are to receive or provide data. Note that during a write access to the memory 100, all of the memory cells coupled to a selected one of word lines WL0 to WLN are enabled to receive data signals from the bit lines. This is because asserting a word line in the illustrated embodiment disturbs the stored states of all of the memory cells coupled to the word line. During a write operation to the first row of memory cells 110, 116, 122, W/R signal is set to turn the output of NAND gate 106 to zero to cut off the power supply of VDDR0 to memory cells 110, 116, 122, thereby improving the robustness of the write operation by preventing contention at the storage nodes 142, 144 of the memory cells. The word line signals WL0-WLN are set depending on which rows are being written.

In a memory used to store instructions and/or data for use by a processor, it is common for the memory to be organized such that the number of columns is equal to a "cache line". A number of bits equal to the cache line width are accessed during each memory operation. In the illustrated embodiment, the address signals COLUMN ADDRESS determines which memory cells of a row are selected to provide data during a read operation.

Figure 2:
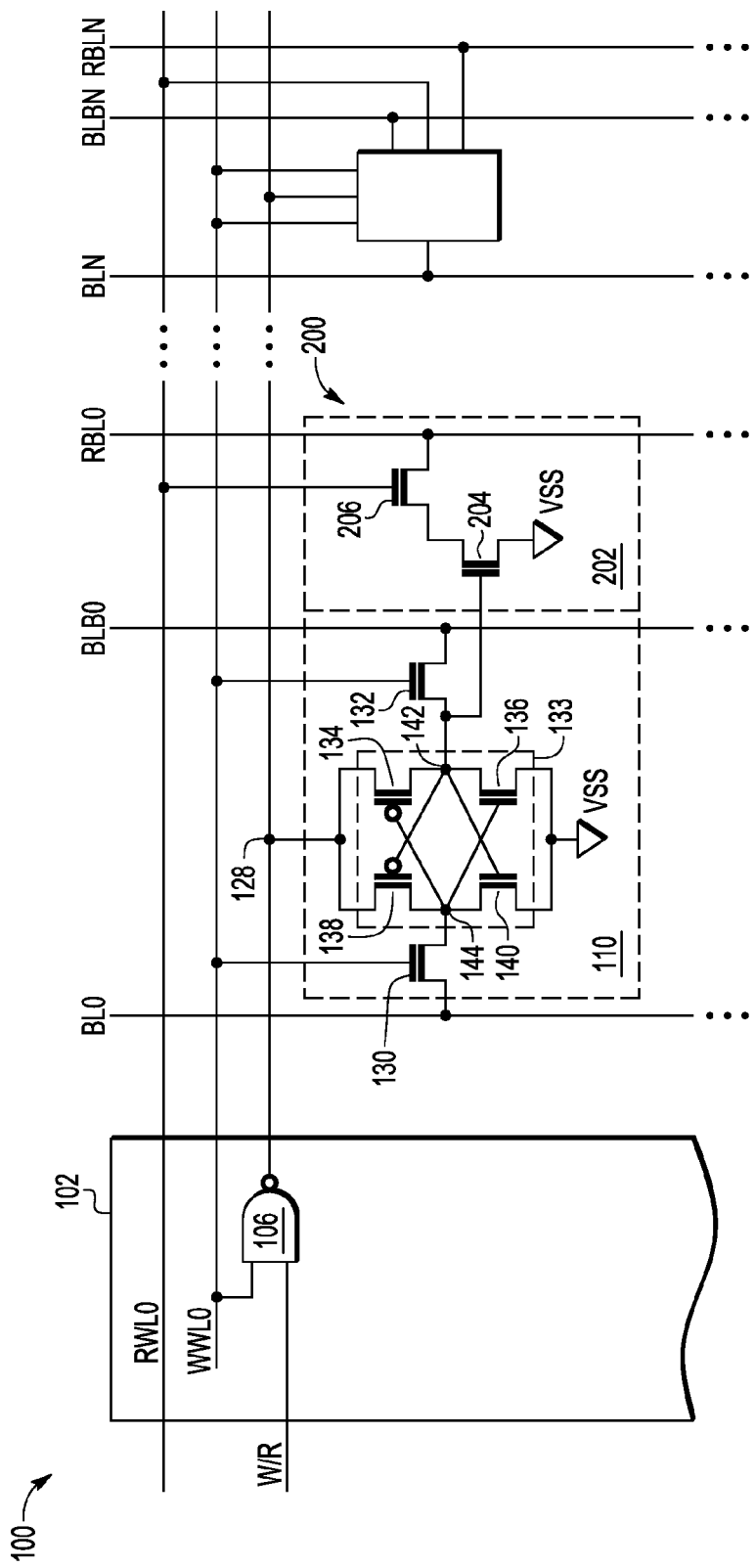
FIG. 2 illustrates, in schematic diagram form, one embodiment of a two port memory cell of the memory of FIG. 1.

FIG. 2 illustrates, in schematic diagram form, an embodiment of an 8-transistor (8-T) memory cell 200 including memory cell 110 and read port 202 that can be used in memory 100. Memory cell 200 includes six transistor (6T) memory cell 110 with a pair of cross-coupled inverters 133 and access transistors 130 and 132, and a read port 202. Cross-coupled inverters 133 include one inverter having P-channel transistor 138 and N-channel transistor 140, and another inverter having P-channel transistor 134 and N-channel transistor 136. Read port 202 includes N-channel transistors 204 and 206 coupled in series.

In read port 202, N-channel transistor 204 has a first drain/source terminal connected to a power supply voltage labeled "VSS", a second drain/source terminal, and a gate connected to storage node 142. Power supply conductor VSS is routed over the plurality of memory cells 104 (FIG. 1) to provide the memory cells with a ground or other reference voltage connection. N-channel transistor 206 has a first drain/source terminal connected to the first drain/source terminal of transistor 204, a second drain/source terminal connected to a read bit line labeled "RBL0", and a gate connected to a read word line labeled "RWL0".

The read word lines RWL0-RWLN are coupled to row decoder 102. The read bit lines and write bit lines run in the column direction, and the write word lines and read word lines run in the row direction.

At the beginning of a read operation the word line WWL0 is a logic low, allowing the pair of cross-coupled inverters 133 to maintain the logic state of the storage nodes 144/142. Conversely, storage node 142 is being maintained as a logic high voltage. Note that for the purpose of explaining the read operation, a "logic high" voltage is a positive voltage and a "logic low" voltage is equal to about ground potential. In other embodiments, the voltages may be different. The read bit line RBL0 is precharged to a logic high. In another embodiment, the read bit lines may be precharged to ground or to an intermediate voltage. Just after a start time, row decoder 102 asserts read word line RWL0 as a logic high causing N-channel transistor 206 to become conductive. N-channel transistor 204 is already conductive because storage node 142 is storing a logic high. Transistors 204 and 206 cause the logic high precharge voltage on the read bit line RBL0 to be reduced to a logic low. The logic low voltage is provided to a sense amplifier of column logic 109 and is then output as a bit of DATA. After a predetermined amount of time, the read operation ends with read word line RWL0 returning to a logic low potential. The logic low of read word line RWL0 causes transistor 206 to become substantially non-conductive, allowing bit line precharge circuitry of column logic 109 to return the potential of read bit line RBL0 to a logic high in preparation for another read operation.

Figure 3:
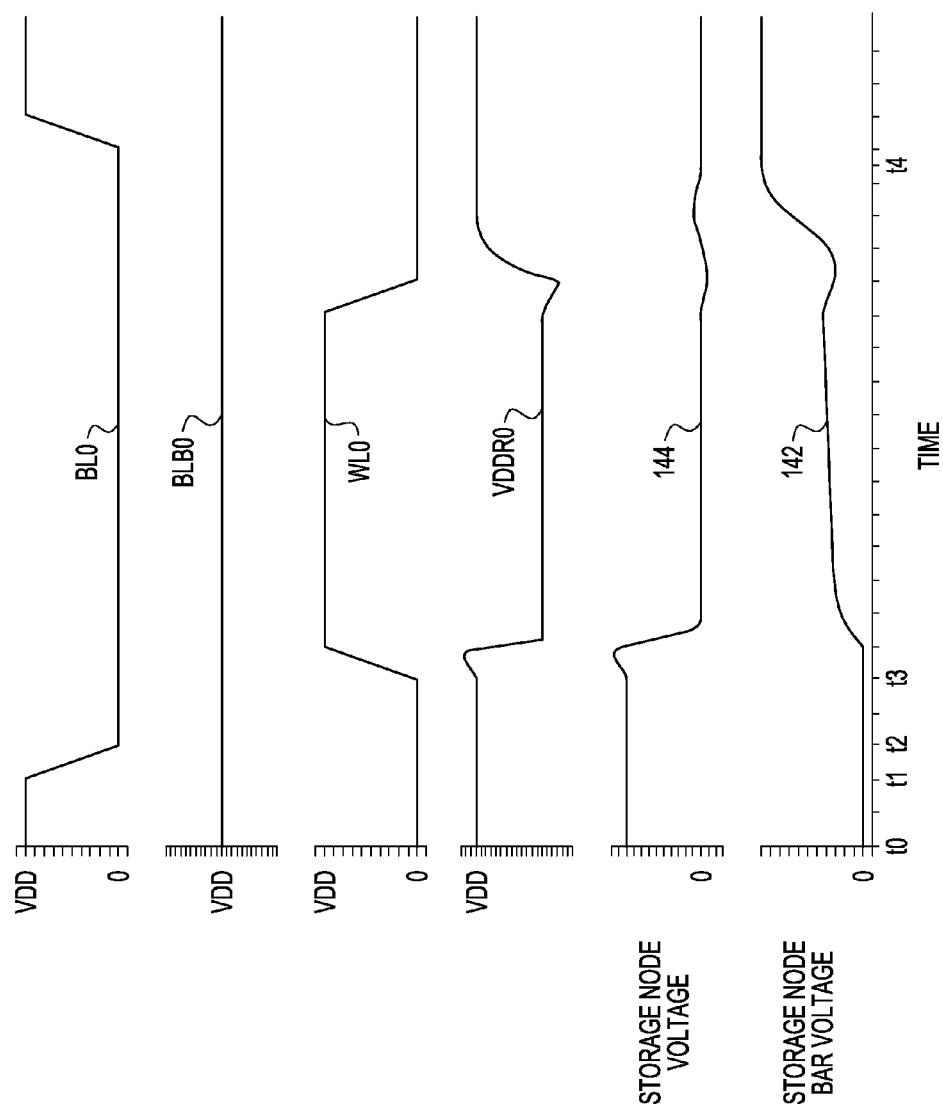
FIG. 3 illustrates a timing diagram of various signals of the memory cell of FIGS. 1 or 2 during a write operation.

FIG. 3 illustrates a timing diagram of various signals of the memory cells 110, 200 of FIGS. 1 and 2 versus time during a write operation. Note that in the illustrated embodiment, a "logic high" voltage is a positive voltage and a "logic low" voltage is equal to about ground potential. In other embodiments, the voltages may be different.

As illustrated in FIG. 3, a write operation to memory cell 110 occurs between times t1 and t4. Prior to the write operation, memory cell 110 is storing a logic high by voltage on storage nodes 144 and 142 being a logic high and a logic low, respectively. Also, prior to the write operation (at time t1), bit line BL0 is de-asserted and allowed to go from a precharged logic high to logic low voltage by write circuitry of column logic 109. Bit line bar BLB0 remains precharged to a logic high. To begin the write operation, word line WL0 is asserted at time t3 as a logic high by row decoder 102. The logic high word line WL0 causes pass gates 130 and 132 to be conductive, coupling storage node 144 to bit line BL0 and storage node 142 to bit line BLB0. When the write/read signal WR is high and write assist enable signal WAE is high, the voltage at power supply node 128 is cut off, causing the voltage at storage node 144 to decrease to logic low. (Note that the use of the write assist enable signal is optional).

A logic low voltage is to be written to memory cell 110, as indicated by bit line BL0 being a logic low. The logic state of bit line BL0 is provided to storage node 144 via access transistor 130. Also, bit line BLB0 is provided to storage node 142 via transistor 132. The logic low voltage of bit line BL0 causes the voltage of storage node 144 to be reduced below the voltage of storage node 142 to a voltage low enough such that the storage node 144 will be remain at logic low when the word line WL0 is de-asserted. Voltage at power supply node 128 remains at about ground potential. Once word line WL0 is de-asserted, access transistors 130 and 132 become substantially non-conductive and the supply voltage at node 128 returns to logic high. The inverters of the pair of cross-coupled inverters 133 begin to function and the bistable nature of the cross-coupled inverters causes the voltage of storage node 144 to remain at a logic low and the voltage of storage node 142 to increase to a logic high. The write operation ends at time t4. The bit lines BL0 and BLB0 are then precharged in preparation for another write operation.

By now it should be appreciated that in some embodiments, a memory 100 is provided that includes an array of memory cells 104. Each memory cell 110 of the array includes a first supply voltage terminal 128 and a second supply voltage terminal VSS. A plurality of word lines are coupled to the memory cells. A plurality of voltage supply lines VDDR0-VDDRN are coupled to a first voltage supply terminal of subsets of memory cells. A row decoder 102 controls a voltage on each of the plurality of word lines and the voltage supply lines. During at least one mode of operation, the row decoder provides a low voltage state voltage on a voltage supply line of the plurality of voltage supply lines during a write operation to a subset of memory cells. The row decoder provides a high voltage state voltage to the voltage supply line during a read operation of the subset of the memory cells.

In another aspect, the subsets of the memory cells are characterized as rows of memory cells of the array.

In another aspect, for each voltage supply line of the plurality of voltage supply lines, a voltage provided on a voltage supply line coupled to a subset of memory cells of the plurality of subsets is dependent upon a voltage provided on a word line of the plurality of word lines that is coupled to the subset of memory cells.

In another aspect, the row decoder includes a plurality of logic circuits, each logic circuit including an output for controlling a voltage of a voltage supply line of the plurality of voltage supply lines. Each logic circuit includes an input coupled to a word line of the plurality of word lines that is coupled to a subset of memory cells of the plurality of subsets that the voltage supply line is coupled to.

In another aspect, each logic circuit of the plurality of logic circuits performs a logical NAND operation with a word line coupled to the input of the logic circuit being an input of the logical NAND operation and the output of the logic circuit being an output of the logical NAND operation.

In another aspect, a write/read signal is a second input of the logical NAND operation for each logic circuit of the plurality of logic circuits.

In another aspect, each logic circuit of the plurality of logic circuits performs a logic inverter function with a word line coupled to the input of the logic circuit being an input of the logic inverter function and the output of the logic circuit being an output of the logic inverter function, such that a voltage supply line of the plurality of voltage supply lines coupled to the output of the logic circuit is provided at an inverted voltage state to a voltage state of the word line coupled to the input of the logic circuit.

In another aspect, during at least one mode of operation, for each voltage supply line of the plurality of voltage supply lines, the row decoder provides a low voltage state voltage on a voltage supply line of the plurality of voltage supply lines coupled to a subset of the plurality of subsets during a write operation to the memory cells of the subset while providing a high voltage state voltage on a word line of the plurality of word lines that is coupled to the subset.

In another aspect, the memory cells of the array are characterized as 6T SRAM memory cells.

In another aspect, the plurality of word lines are characterized as write word lines. The memory further includes a plurality of read word lines. Each memory cell of the array is coupled to a read word line of the plurality of read word lines.

In another aspect, the row decoder provides a high voltage state voltage on voltage supply lines of the plurality of voltage supply lines coupled to subsets of the plurality of subsets not being written to during a during a write operation to a subset of the plurality of subsets.

In another aspect, in at least one mode of operation, for each memory cell of the array, the first supply voltage terminal receives a higher voltage than the second supply voltage terminal during a read operation of the memory cell.

In another embodiment, a method for operating a memory comprises performing a write operation to a plurality of memory cells. Each cell of the plurality of memory cells is coupled to a word line, and includes a voltage supply terminal coupled to a voltage supply line. During the write operation, a voltage at a high voltage state is provided on the word line and a voltage at a low voltage state is provided on the voltage supply line. A read operation of the plurality of memory cells is performed. During the read operation, a voltage at a high voltage state is provided on the voltage supply line.

In another aspect, a voltage of the voltage supply line is produced by performing a logical NAND function where a voltage of the word line is an input of the logical NAND function.

In another aspect, a write/read signal is a second input of the logical NAND function.

In another aspect, during the write operation and read operation, the voltage state of the word line is an opposite voltage state of the voltage supply line.

In another aspect, the memory cells of the plurality of memory cells each include a read port and the word line is characterized as a write word line.

In another aspect, during the write operation, the voltage state of the word line is an opposite voltage state of the voltage supply line.

In another embodiment, a memory comprises an array of SRAM memory cells. Each memory cell of the array includes a first supply voltage terminal and a second supply voltage terminal. Each memory cell of the array is coupled to a word line of a plurality of word lines. Each voltage supply line of a plurality of voltage supply lines is coupled to a first voltage supply terminal of a subset of memory cells of a plurality of subsets of memory cells of the array. Each subset of the plurality of subsets includes a plurality of memory cells. A row decoder controls a voltage on each of the plurality of word lines and each of the plurality of voltage supply lines. During at least one mode of operation, for each voltage supply line of the plurality of voltage supply lines, the row decoder provides a low voltage state voltage on a voltage supply line of the plurality of voltage supply lines coupled to a subset of the plurality of subsets during a write operation to the memory cells of the subset while providing a high voltage state voltage on a word line of the plurality of word lines that is coupled to the subset.

In another aspect, during at least one mode of operation for each memory cell of the array, the first supply voltage terminal receives a higher voltage than the second supply voltage terminal during a read operation of the memory cell.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

As used herein, the term "bus" is used to refer to a plurality of signals or conductors which may be used to transfer one or more various types of information, such as data, addresses, control, or status. The conductors as discussed herein may be illustrated or described in reference to being a single conductor, a plurality of conductors, unidirectional conductors, or bidirectional conductors. However, different embodiments may vary the implementation of the conductors. For example, separate unidirectional conductors may be used rather than bidirectional conductors and vice versa. Also, plurality of conductors may be replaced with a single conductor that transfers multiple signals serially or in a time multiplexed manner. Likewise, single conductors carrying multiple signals may be separated out into various different conductors carrying subsets of these signals. Therefore, many options exist for transferring signals.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory comprising:
   an array of memory cells, wherein each memory cell of the array includes a first supply voltage terminal and a second supply voltage terminal;
   a plurality of word lines, wherein each memory cell of the array is coupled to a word line of the plurality of word lines;
   a plurality of voltage supply lines, each voltage supply line of the plurality of voltage supply lines is coupled to a first voltage supply terminal of a subset of memory cells of a plurality of subsets of memory cells of the array, wherein each subset of the plurality of subsets includes a plurality of memory cells;
   a row decoder, the row decoder controls a voltage on each of the plurality of word lines, the row decoder controls a voltage on each of the plurality of voltage supply lines, wherein during at least one mode of operation, for each voltage supply line of the plurality of voltage supply lines, the row decoder provides a low voltage state voltage on a voltage supply line of the plurality of voltage supply lines during a write operation to a subset of memory cells of the plurality of subsets coupled to the voltage supply line and the row decoder provides a high voltage state voltage to the voltage supply line during a read operation of the subset of the memory cells.

2. The integrated circuit of claim 1 wherein the subsets of the plurality of subsets are characterized as rows of memory cells of the array.

3. The memory of claim 1 wherein for each voltage supply line of the plurality of voltage supply lines, a voltage provided on a voltage supply line coupled to a subset of memory cells of the plurality of subsets is dependent upon a voltage provided on a word line of the plurality of word lines that is coupled to the subset of memory cells.

4. The memory of claim 3 wherein the row decoder includes a plurality of logic circuits, each logic circuit of the plurality of logic circuits including an output for controlling a voltage of a voltage supply line of the plurality of voltage supply lines, wherein each logic circuit includes an input coupled to a word line of the plurality of word lines that is coupled to a subset of memory cells of the plurality of subsets that the voltage supply line is coupled to.

5. The memory of claim 4 wherein each logic circuit of the plurality of logic circuits performs a logical NAND operation with a word line coupled to the input of the logic circuit being an input of the logical NAND operation and the output of the logic circuit being an output of the logical NAND operation.

6. The memory of claim 5 wherein a write/read signal is a second input of the logical NAND operation for each logic circuit of the plurality of logic circuits.

7. The memory of claim 4 wherein each logic circuit of the plurality of logic circuits performs a logic inverter function with a word line coupled to the input of the logic circuit being an input of the logic inverter function and the output of the logic circuit being an output of the logic inverter function, such that a voltage supply line of the plurality of voltage supply lines coupled to the output of the logic circuit is provided at an inverted voltage state to a voltage state of the word line coupled to the input of the logic circuit.

8. The memory of claim 1 wherein during at least one mode of operation, for each voltage supply line of the plurality of voltage supply lines, the row decoder provides a low voltage state voltage on a voltage supply line of the plurality of voltage supply lines coupled to a subset of the plurality of subsets during a write operation to the memory cells of the subset while providing a high voltage state voltage on a word line of the plurality of word lines that is coupled to the subset.

9. The memory of claim 1 wherein the memory cells of the array are characterized as 6T SRAM memory cells.

10. The memory of claim 1 wherein the plurality of word lines are characterized as write word lines, wherein the memory includes a plurality of read word lines wherein each memory cell of the array is coupled to a read word line of the plurality of read word lines.

11. The memory of claim 1, wherein the row decoder provides a high voltage state voltage on voltage supply lines of the plurality of voltage supply lines coupled to subsets of the plurality of subsets not being written to during a during a write operation to a subset of the plurality of subsets.

12. The memory of claim 1 wherein in at least one mode of operation, for each memory cell of the array, the first supply voltage terminal receives a higher voltage than the second supply voltage terminal during a read operation of the memory cell.

13. A method for operating a memory comprising:
   performing a write operation to a plurality of memory cells, wherein each cell of the plurality of memory cells is coupled to a word line, each cell of the plurality of memory cells includes a voltage supply terminal coupled to a voltage supply line, wherein during the write operation, a voltage at a high voltage state is provided on the word line and a voltage at a low voltage state is provided on the voltage supply line;

performing a read operation of the plurality of memory cells, wherein during the read operation, a voltage at a high voltage state is provided on the voltage supply line.

14. The method of claim 13 wherein a voltage of the voltage supply line is produced by performing a logical NAND function where a voltage of the word line is an input of the logical NAND function.

15. The method of claim 14, wherein a write/read signal is a second input of the logical NAND function.

16. The method of claim 13 wherein during the write operation and read operation, the voltage state of the word line is an opposite voltage state of the voltage supply line.

17. The method of claim 13 wherein the memory cells of the plurality of memory cells each include a read port and the word line is characterized as a write word line.

18. The method of claim 13 wherein during the write operation, the voltage state of the word line is an opposite voltage state of the voltage supply line.

19. A memory comprising:
an array of SRAM memory cells, wherein each memory cell of the array includes a first supply voltage terminal and a second supply voltage terminal;
a plurality of word lines, wherein each memory cell of the array is coupled to a word line of the plurality of word lines;
a plurality of voltage supply lines, each voltage supply line of the plurality of voltage supply lines is coupled to a first voltage supply terminal of a subset of memory cells of a plurality of subsets of memory cells of the array, wherein each subset of the plurality of subsets includes a plurality of memory cells;
a row decoder, the row decoder controls a voltage on each of the plurality of word lines, the row decoder controls a voltage on each of the plurality of voltage supply lines, wherein during at least one mode of operation, for each voltage supply line of the plurality of voltage supply lines, the row decoder provides a low voltage state voltage on a voltage supply line of the plurality of voltage supply lines coupled to a subset of the plurality of subsets during a write operation to the memory cells of the subset while providing a high voltage state voltage on a word line of the plurality of word lines that is coupled to the subset.

20. The memory of claim 19 wherein during at least one mode of operation for each memory cell of the array, the first supply voltage terminal receives a higher voltage than the second supply voltage terminal during a read operation of the memory cell.

* * * * *